United States Patent [19]

Gomyo

[11] Patent Number: 4,974,231
[45] Date of Patent: Nov. 27, 1990

[54] VISIBLE LIGHT SEMICONDUCTOR LASER

[75] Inventor: Akiko Gomyo, Tokyo, Japan

[73] Assignee: NEC Corporation, Tokyo, Japan

[21] Appl. No.: 299,389

[22] Filed: Jan. 23, 1989

[30] Foreign Application Priority Data

Jan. 20, 1988 [JP] Japan .................................. 63-11128

[51] Int. Cl.$^5$ .............................................. H01S 3/19
[52] U.S. Cl. ........................................ 372/45; 372/46; 357/16; 357/17; 357/60
[58] Field of Search ....................... 372/45, 46; 357/16, 357/17, 60

[56] References Cited

U.S. PATENT DOCUMENTS 4,383,319 5/1983 Shimizu et al. ...................... 372/45

FOREIGN PATENT DOCUMENTS 0007730 2/1980 European Pat. Off. ................ 32/45
1378128 12/1974 United Kingdom ................... 372/45

OTHER PUBLICATIONS

Ermakov et al., "Yellow-Green $In_{1-x}Ga_xP$ and $In_{1-x}Ga_xP_{1-z}As_z$ LED's and Electron-Beam-Pumped Lasers Prepared by LPE and VPE", IEEE Electron Devices, vol. Ed. 26, No. 8, Aug. 1979, pp. 1190-1193.

Hirtz et al., A Low-Beam-Divergence cw(GaAl)As Double-Heterostructure Laser Grown by Low Pressure Metallorganic Chemical Vapor Deposition Process, Appl. Phys. Lett., 36(10), May 15, 1980, pp. 795-796.

Kresels, et al., "Visible $GaAs_{0.7}P_{0.3}$cw Heterojunction Lasers*", Appl. Phys. Letts., vol. 30, No. 5, Mar. 1, 1977, pp. 249-251.

K. Kobayashi et al., "AlGaInP Double Heterostructure ... Phase Epitaxy", IEEE Jour. of Quantum Electronics, vol. QE-23, No. 6, Jun. 1987, pp. 704-711.

A. Gomyo et al., "Evidence of the Existence of an Ordered ... Band-Gap Energy", Appl. Phys. Lett. 50 (11), Mar. 16, 1987, pp. 673-675.

Primary Examiner—William L. Sikes
Assistant Examiner—Georgia Y. Epps
Attorney, Agent, or Firm—Sughrue, Mion, Zinn, Macpeak & Seas

[57] ABSTRACT

In a visible light semiconductor laser with $(Al_xGa_{1-x})_{0.5}In_{0.5}P$ ($0 \leq x \leq 1$) crystal layers and a process for growing an $(Al_xGa_{1-x})_{0.5}In_{0.5}P$ ($0 \leq x \leq 1$) crystal, a GaAs substrate on which $(Al_xGa_{1-x})_{0.5}In_{0.5}P$ is grown in an epitaxial method selected from MOVPE and MBE provides one selected from a (110) plane, a plane equivalent to the (110) plane, a (111) plane, and a plane equivalent to the (111) plane as a main plane for a crystal growth of $(Al_xGa_{1-x})_{0.5}In_{0.5}P$. As a result, a bandgap energy Eg of the $(Al_xGa_{1-x})_{0.5}In_{0.5}P$ crystal can be maximum value inherent to the mixed independent on a growth temperature and V/III ratio. $_{.5}In_{0.5}P$ ($0 \leq x \leq 1$) crystal layers and a process for growing an$(Al_xGa_{1-x})_{0.5}In_{0.5}P$ ($0 \leq x \leq 1$) crystal, a GaAs substrate on which $(Al_xGa_{1-x})_{0.5}In_{0.5}P$ is grown in an epitaxial method selected from MOVPE and MBE provides one selected from a (110) plane, a plane equivalent to the (110) plane, a (111) plane, and a plane equivalent to the (111) plane as a main plane for a crystal growth of $(Al_xGa_{1-x})_{0.5}In_{0.5}P$. As a result, a bandgap energy Eg of the $(Al_xGa_{1-x})_{0.5}In_{0.5}P$ crystal can be the maximum value inherent to the mixed crystal independent on a growth temperature and a V/III ratio.

7 Claims, 4 Drawing Sheets

33 RAW MATERIAL GAS FLOW
32 Ga$_{0.5}$In$_{0.5}$P LAYER
31 GaAs SUBSTRATE

VISIBLE LIGHT SEMICONDUCTOR LASER

FIELD OF THE INVENTION

The invention relates to a visible light semiconductor laser with $(Al_xGa_{1-x})_{0.5}In_{0.5}P$ crystal layer and a process for growing an $(Al_xGa_{1-x})_{0.5}In_{0.5}P$ crystal, and more particularly to a semiconductor laser including an active layer of an $(Al_xGa_{1-x})_{0.5}In_{0.5}P$ crystal layer and a process for growing an $(Al_xGa_{1-x})_{0.5}In_{0.5}P$ crystal having a predetermined bandgap energy under a less restricted growth condition of a growth temperature and a V/III ratio.

BACKGROUND OF THE INVENTION $(Al_xGa_{1-x})_{0.5}In_{0.5}P$ ($0 \leqq x \leqq 1$) crystal which is lattice-matched to a GaAs substrate is an important material for a visible light semiconductor laser. Such a semiconductor laser comprises a first cladding layer of n - $(Al_{0.5}Ga_{0.5})_{0.5}In_{0.5}$, an active layer of undoped $Ga_{0.5}In_{0.5}P$ ($x = 0$), and a second cladding layer of p - $(Al_{0.5}Ga_{0.5})_{0.5}In_{0.5}P$ which provide a double heterostructure grown on a (001) plane of an n - GaAs substrate (simply defined "(001) GaAs substrate" hereinafter). The semiconductor laser further comprises a current blocking layer of n - GaAs having a stripe-shaped groove, and a cap layer of p - GaAs successively grown on the second cladding layer, a first electrode provided on the cap layer, and a second electrode provided on a bottom surface of the GaAs substrate. In the semiconductor laser, the epitaxial layers are grown on the above explained (001) GaAs substrate or a plane oriented in regard to the (001) plane by two degrees (2°), for instance, as described on pages 704 to 711 of "IEEE Journal of Quantum Electronics, Vol. QE-23, No. 6, June 1987" and pages 1084 and 1085 of "Electronics Letters, Vol. 21, 1985".

In operation, a predetermined voltage is applied across the first and second electrodes of the semiconductor laser, so that current is injected limitedly into the stripe region in the presence of the current blocking layer. As a result, visible light having a wavelength which is determined dependent on a bandgap energy Eg of the active layer is emitted from the semiconductor.

In the fabrication of such a visible light semiconductor laser, metalorganic vapor phase epitaxy (MOVPE) or molecular beam epitaxy (MBE) is generally adopted for the crystal growth of respective layers. In a case of using MOVPE, $Ga_{0.5}In_{0.5}P$ ($x = 0$) crystal lattice-matched to a GaAs substrate is grown on a (001) GaAs substrate or a two degree-oriented plane thereto under the crystal growth condition that a growth temperature ranges 550 to 750° C., a V/III ratio is less than 500, and a flow amount of a raw material gas is kept constant. A bandgap energy Eg of the $Ga_{0.5}In_{0.5}P$ crystal thus grown thereon is varied from 1.85 to 1.91 eV dependent on a combination of a growth temperature and a V/III ratio in such a state that the $Ga_{0.5}In_{0.5}P$ crystal is lattice-matched to the GaAs substrate. The variation of the bandgap energy Eg is caused by the difference of atomic distributions on column III sublattices. That is, where a superlattice structure in which Ga and In are orderly distributed on the column III sublattices is grown, the bandgap energy Eg is 1.85 eV, and where a crystal in which Ga and In are randomly distributed on the column III sublattices is grown, the bandgap energy Eg is 1.9 eV, as described on pages 673 to 675 of "Appl. Phys. Lett. 50(11), 16 Mar. 1987". Even in a case of using MBE, the variation of a bandgap energy Eg occurs in a range of 60 meV dependent on a combination of a growth temperature and a V/III ratio, where the $Ga_{0.5}In_{0.5}P$ layer is grown on the (001) GaAs substrate or the two degree-oriented plane. Such a phenomenon that a bandgap energy Eg varies dependent on a growth condition is also observed in a $(Al_xGa_{1-x})_{0.5}In_{0.5}P$ ($x \neq 0$) crystal, for instance, a $(Al_{0.5}Ga_{0.5})_{0.5}In_{0.5}P$ ($x = 0.5$) crystal which is grown in either MOVPE or MBE on a GaAs substrate.

For these reasons, a growth temperature and a V/III ratio are strictly controlled to be in a narrow tolerance in growing the $Ga_{0.5}In_{0.5}P$ crystal having the maximum bandgap energy Eg of 1.9 eV, in which an average value of Ga composition is 0.5 in the crystal, by using MOVPE or MBE. Therefore, it is difficult and even more impossible to grow a $Ga_{0.5}In_{0.5}P$ crystal layer having a room temperature bandgap energy of 1.91 eV, for instance, where a semiconductor laser including an active layer of a $Ga_{0.5}In_{0.5}P$ crystal is fabricated because a growth condition is restricted even in a crystal growth of layers other than the $Ga_{0.5}In_{0.5}P$ crystal, so that the growth condition tends to deviate from the aforementioned narrow tolerance. As a result, the bandgap energy Eg of the $Ga_{0.5}In_{0.5}P$ active layer becomes less than 1.91 eV, so that a semiconductor laser having the minimum oscillation wavelength of approximately 650 nm which is inherent to the mixed crystal is not obtained, and the oscillation wavelength is increased up to the range of 670 to 690 nm due to the deviated growth condition. This results in the deterioration of stability and reproducibility in a oscillation wavelength in a semiconductor laser. The same disadvantage is induced in a semiconductor laser including an active layer of $(Al_xGa_{1-x})_{0.5}In_{0.5}P$ in which an oscillation wavelength shorter than that of the $Ga_{0.5}In_{0.5}P$ active layer is obtained.

SUMMARY OF THE INVENTION

Accordingly, it is an object of the invention to provide a visible light semiconductor laser including an active layer of an $(Al_xGa_{1-x})_{0.5}In_{0.5}P$ ($0 \leqq x \leqq 1$) crystal from which light having the maximum value of a photon energy (the minimum oscillation wavelength) inherent to the mixed crystal is emitted.

It is a further object of the invention to provide a process for growing a $(Al_xGa_{1-x})_{0.5}In_{0.5}P$ crystal in which the maximum value of a bandgap energy inherent to the mixed crystal is stably obtained.

According to a feature of the invention, a visible light semiconductor laser with a $(Al_xGa_{1-x})_{0.5}In_{0.5}P$ ($0 \leqq x \leqq 1$) crystal layer comprises, a GaAs substrate, epitaxial layers grown on said GaAs substrate including an active layer of said $(Al_xGa_{1-x})_{0.5}In_{0.5}P$ crystal layer, and p and n-electrodes for applying a predetermined voltage across said GaAs substrate and said epitaxial layers, wherein a main plane of said GaAs substrate is one selected from a (110) plane, a plane equivalent to said (110) plane, a (111) plane, and a plane equivalent to said (111) plane.

According to another feature of the invention, a process for growing an $(Al_xGa_{1-x})_{0.5}In_{0.5}P$ crystal comprises, providing a GaAs substrate having a main plane selected from a (110) plane, a plane equivalent to said (110) plane, a (111) plane, and a plane equivalent to said (111) plane, and growing said $(Al_xGa_{1-x})_{0.5}In_{0.5}P$ crystal in an epitaxial method selected from metalorganic vapor phase epitaxy and molecular beam epitaxy on said main plane of said GaAs substrate by flowing a predetermined amount of raw material gas having a predetermined V/III ratio onto said main plane of said GaAs substrate at a predetermined growth temperature.

BRIEF DESCRIPTION OF DRAWINGS

The invention will be explained in more detail in conjunction with appended drawings wherein.

DESCRIPTION OF PREFERRED EMBODIMENTS

Figure 1:
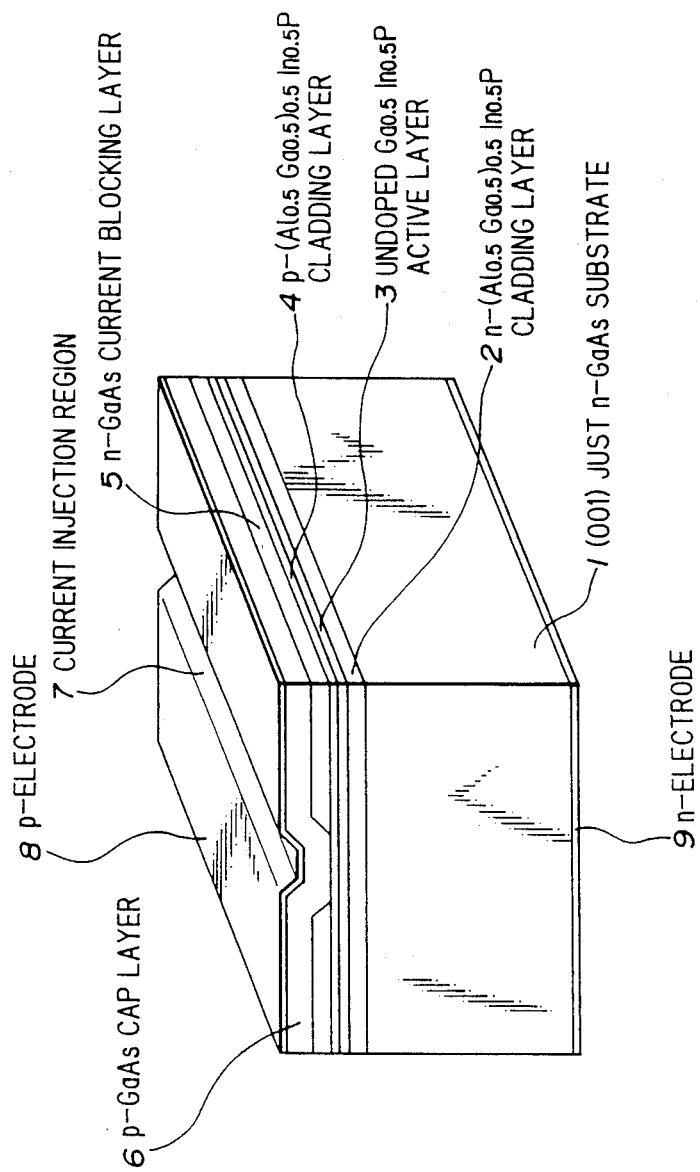
FIG. 1 is a schematic view showing a conventional visible light semiconductor laser.

Before explaining an embodiment according to the invention, the aforementioned conventional visible light semiconductor laser will be explained in FIG. 1. The semiconductor laser comprises a first cladding layer 2 of n - $(Al_{0.5}Ga_{0.5})_{0.5}In_{0.5}P$, an active layer 3 of undoped $Ga_{0.5}In_{0.5}P$, and a second cladding layer 4 of p - $(Al_{0.5}Ga_{0.5})_{0.5}In_{0.5}P$ which provide a double heterostructure grown on a (001) just n - GaAs substrate. The semiconductor laser further comprises a current blocking layer 5 of n - GaAs having a stripe-shaped groove, and a cap layer 6 of p - GaAs successively grown on the second cladding layer 4, a p - electrode provided on the cap layer 6, and an n - electrode provided on a bottom surface of the n - GaAs substrate 1.

The aforementioned operation, disadvantages etc. of the conventional visible light semiconductor laser will not be explained here.

Next, principle of the invention will be explained in FIG. 2 wherein a growth temperature is represented on X axis, a V/III ratio is represented on Y axis, and a bandgap energy Eg of $Ga_{0.5}In_{0.5}P$ crystals grown on (001), (110) and (111) GaAs substrates to be latticematched thereto in MOVPE is represented on Z axis. In a process for growing the $Ga_{0.5}In_{0.5}P$ crystals, one selected from $(CH_3)_3In$ and $(C_2H_5)_3In$ is used for a column III raw material of In, and one selected from $(CH_3)_3Ga$ and $(C_2H_5)_3Ga$ is used for a column III raw material of Ga, while $PH_3$ is used for a column V raw material, so that fixed amounts of In and Ga raw material gases are coexistently flowed into a reaction chamber, and a flow amount of $PH_3$ is changed to control a V/III ratio. In deciding the V/III ratio, a flow amount of column III gases is controlled by a total net amount of In and Ga gases. In a case where impurity density is less than $1 \times 10^{18}$ cm$^{-3}$, a bandgap energy Eg of a $Ga_{0.5}In_{0.5}P$ crystal lattice-matched on the (001) GaAs substrate thereto ranges from 1.84 to 1.91 eV under a growth condition that a growth temperature is from 600 to 750° C., and a V/III ratio is 60 to 450. A relation of the growth temperature, the V/III ratio, and the bandgap energy Eg is defined as a curvature plane having a bottom plane corresponding to 1.84 eV at the growth temperature of 650 to 700° C. and the V/III ratio of 410, and it is found that atomic distributions change as the bandgap energy Eg varies. This is caused by following reasons. That is, a growth mechanism such as a average diffusion distance by which column III atoms of In and Ga diffuse on a growth surface of the $Ga_{0.5}In_{0.5}P$ crystal varies dependent on the growth temperature and the V/III ratio where the $Ga_{0.5}In_{0.5}P$ crystal is grown in MOVPE on the (001) GaAs substrate. Further, an atomic distribution state of In and Ga in the $Ga_{0.5}In_{0.5}P$ crystal has a substantial connection with the growth temperature due to the existence of imiscible condition for the crystal. For these reasons, the atomic distribution state of Ga and In on column III sublattices of the $Ga_{0.5}In_{0.5}P$ crystal varies dependent on a growth temperature and a V/III ratio at the time of MOVPE crystal growth.

On the contrary, Ga and In are randomly distributed where a $Ga_{0.5}In_{0.5}P$ crystal is grown on a (110) or (111) GaAs substrate, so that the atomic distribution state does not vary in spite of the change of a growth temperature and a V/III ratio. Therefore, a bandgap energy Eg of the $Ga_{0.5}In_{0.5}P$ crystal does not vary even if the growth temperature and the V/III ratio are changed. In other words, a $Ga_{0.5}In_{0.5}P$ crystal having a bandgap energy Eg of 1.91 eV is stably obtained under a state that the crystal is latticematched to a GaAs substrate where the crystal is grown on a (110) or (111) GaAs substrate, not depending on a growth temperature and a V/III ratio at the time of the crystal growth. This is realized not only in a $Ga_{0.5}In_{0.5}P$ crystal, but also in a $(Al_xGa_{1-x})_{0.5}In_{0.5}P$ ($0 \leq x \leq 1$), where a whole or part of Ga is replaced in a GaInP system crystal, although an example of a $Ga_{0.5}In_{0.5}P$ crystal is explained above. This means that the invention can be also applied to a $(Al_xGa_{1-x})_{0.5}In_{0.5}P$ crystal lattice-matched to a GaAs substrate.

Even in a case of using MBE, an $(Al_xGa_{1-x})_{0.5}In_{0.5}P$ crystal having the maximum bandgap energy Eg inherent to the mixed crystal is grown on a (110) or (111) GaAs substrate, although a behaviour of the crystal by which a bandgap energy Eg is determined dependent on a growth temperature and a V/III ratio is somewhat different from that of a MOVPE process.

In accordance with the principle of the invention as described above, a process for growing an $(Al_xGa_{1-x})_{0.5}In_{0.5}P$ crystal in an embodiment according to the invention will be explained in FIGS. 3 and 4 by use of MOVPE.

Figure 3:
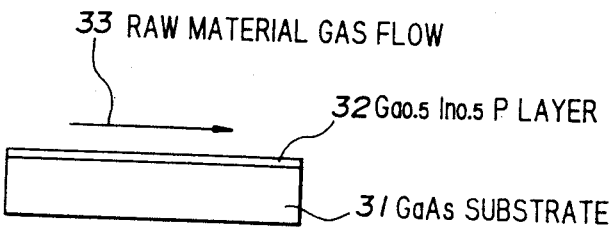
FIG. 3 is an explanatory diagram showing a process for growing a $Ga_{0.5}In_{0.5}P$ layer on a GaAs substrate in an embodiment according to the invention.

In FIG. 3, a raw material gas as indicated by an arrow 33 is flowed on a GaAs substrate 31 to grow a $Ga_{0.5}In_{0.5}P$ epitaxial layer 32 thereon. In the embodiment, the GaAs substrate 31 is provided with a (111) As plane for a main plane in a first example, and with a (110) plane for the main plane in a second example. $(CH_3)_3In$ and $(C_2H_5)_3Ga$ are used for column III raw materials, and flow amounts of the former and latter are $2.16 \times 10^{-5}$ mol/min and 2.64 mol/min, respectively. $PH_3$ is used for column V raw material. The raw material gas 33 is a mixture of the column III and V raw material gases. V/III ratios are set to be 120 and 410 in the control of $PH_3$ flow amount wherein the V/III ratio is defined as "a ratio of column V and III raw materials", and a growth temperature is set to be 700° C.

Figure 4:
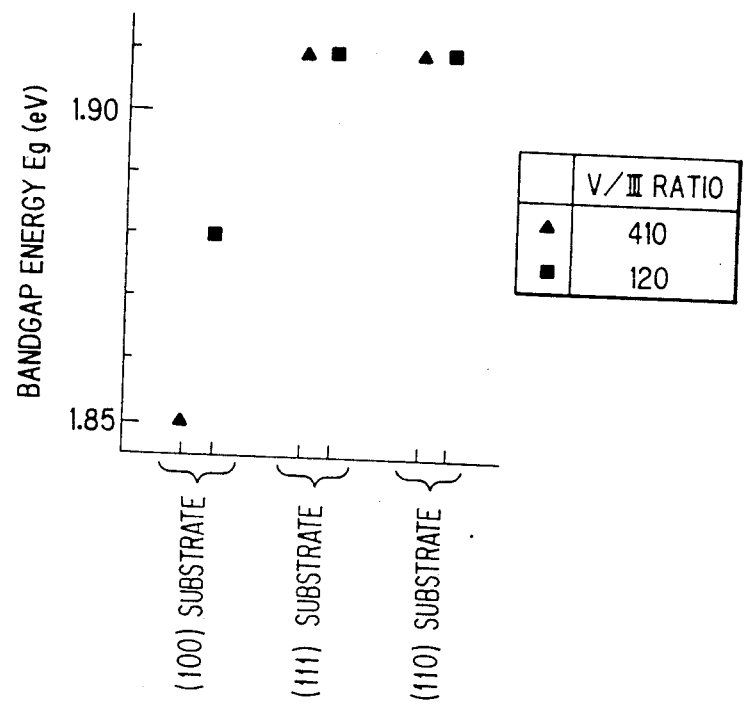
FIG. 4 is an explanatory diagram showing a bandgap energy of $Ga_{0.5}In_{0.5}P$ layers grown on (100), (111) and (110) planes of a GaAs substrate.

FIG. 4 shows a bandgap energy Eg of the $Ga_{0.5}In_{0.5}P$ layer 32 which is thus grown on the GaAs substrate 31. Bandgap energies Eg of $Ga_{0.5}In_{0.5}P$ crystal layers grown on the (110) GaAs substrate and the (111) As GaAs substrate are 1.91 eV equally in the both V/III ratios of 120 and 410. On the other hand, bandgap energies Eg of $Ga_{0.5}In_{0.5}P$ crystal layers grown in MOVPE on a (100) GaAs substrate are 1.85 eV in the V/III ratio of 410, and 1.88 eV in the V/III ratio of 120, although the same growth condition as set in the embodiment is adopted.

Figure 2:
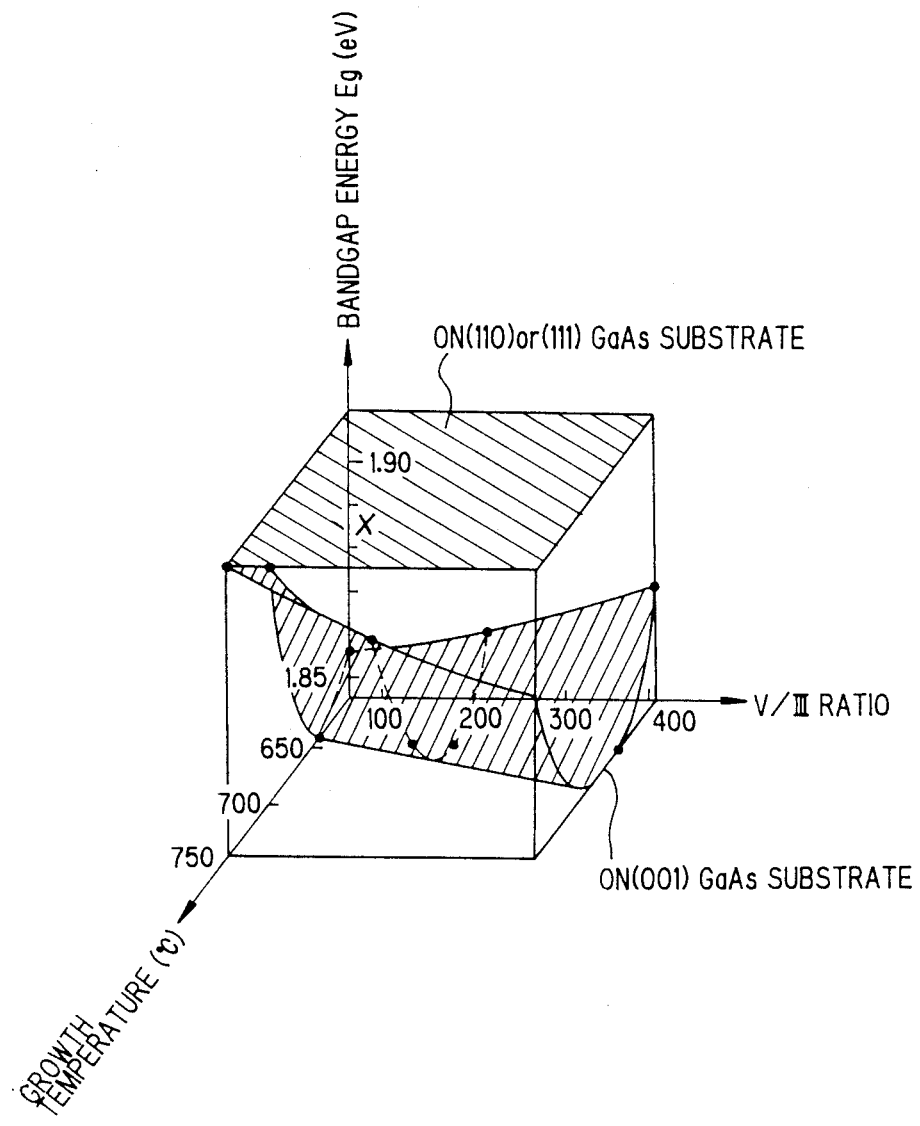
FIG. 2 is an explanatory view showing a growth $Ga_{0.5}In_{0.5}P$ crystal lattice-matched on (001), (110) and (111) planes of a GaAs substrate thereto.

The growth condition may be changed in the embodiment as described in FIG. 2. In more detail, the growth temperature may be from 500 to 800° C., and the V/III ratio may be any value less than 400 as clearly shown in FIG. 2. While, a bandgap energy Eg of a $Ga_{0.5}In_{0.5}P$ crystal layer grown in MOVPE on the (100) GaAs substrate varies dependent on the growth condition as explained before in conjunction with FIG. 2.

In the embodiment, it is confirmed that the above explained relation of a bandgap energy Eg, a growth temperature, and a V/III ratio is stably realized with a good reproducibility, and that electrical and optical properties of a $Ga_{0.5}In_{0.5}P$ are not deteriorated in the range as shown in FIG. 2. Further, a bandgap energy Eg of an $(Al_xGa_{1-x})_{0.5}In_{0.5}P$ ($0 \leq X \leq 1$) crystal layer can be the maximum value inherent to the mixed crystal independent on a growth temperature and a V/III ratio. The same result as that in MOVPE is obtained in MBE.

Figure 5:
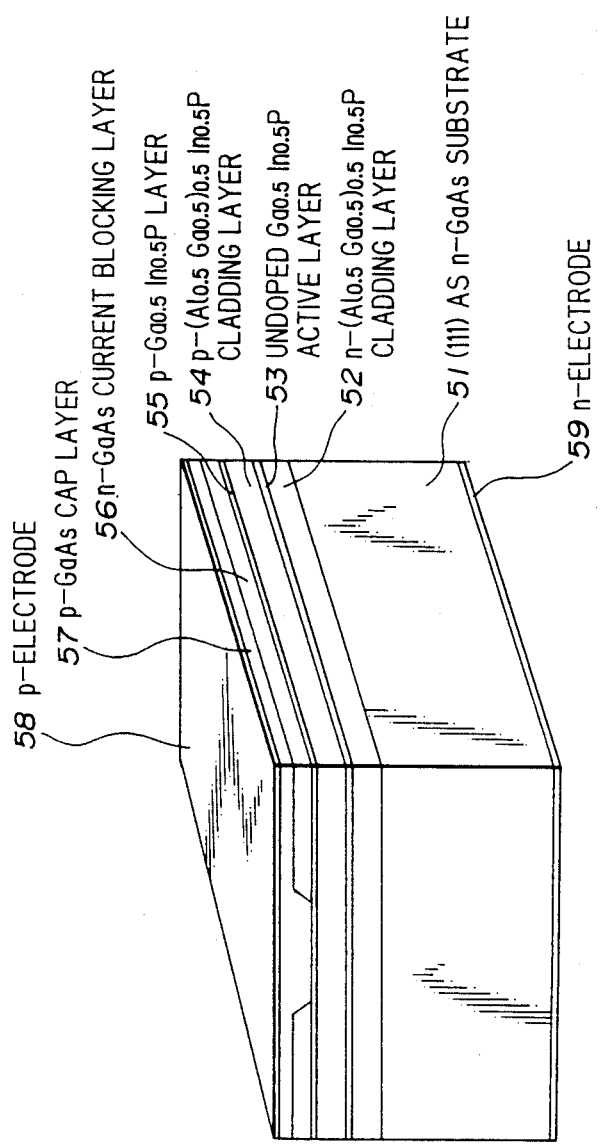
FIG. 5 is a schematic view showing a visible light semiconductor laser in an embodiment according to the invention.

FIG. 5 shows a visible light semiconductor laser with $(Al_xGa_{1-x})_{0.5}In_{0.5}P$ crystal layer in an embodiment according to the invention. The semiconductor laser is fabricated as follows. At first, a cladding layer 52 of n - $(Al_{0.5}Ga_{0.5})_{0.5}In_{0.5}P$ having a thickness of 1 μm, an active layer 53 of undoped $Ga_{0.5}In_{0.5}P$ having a thickness of 0.1 μm, a cladding layer 54 of p - $(Al_{0.5}Ga_{0.5})_{0.5}In_{0.5}P$ having a thickness of 1 μm, a p - $Ga_{0.5}In_{0.5}P$ layer 55 having a thickness of 0.1 μm, and a current blocking layer 56 of n - GaAs having a thickness of 0.6 μm are successively grown on a (111) As main plane of an n - GaAs substrate 51. Then, a part of the current blocking layer 56 is removed in a stripe pattern having a width of 7 μm by a photolithography method. Where an etchant of phosphoric acid system is used in a chemical etching method for the removal of the current blocking layer 56, the stripe portion is only removed therein due to a selective etching property. Thereafter, a cap layer 57 cover a whole surface of the epitaxial layers, and p and n-electrodes 58 and 59 are formed to provide a semiconductor laser diode. The cladding layer 52, the active layer 53, and the cladding layer 54 are grown in MOVPE to provide a double heterostructure, wherein a growth condition of the active layer 53 is based on the aforementioned growth condition, so that a bandgap energy Eg thereof is the maximum value of approximately 1.91 eV which is inherent to a $Ga_{0.5}In_{0.5}P$ crystal independent on a growth temperature and a V/III ratio. Other layers than the active layer 53 may be grown not only in MOVPE, but also in other epitaxial methods.

In operation, when a predetermined voltage is applied across the p and n-electrodes 58 and 59, visible light of the maximum photon energy corresponding to the maximum bandgap energy Eg of approximately 1.91 eV inherent to a $Ga_{0.5}In_{0.5}P$ crystal is emitted from the laser diode. That is, a wavelength of the light thus emitted is approximately 650 nm.

In the embodiment, although the active layer 53 is a $Ga_{0.5}In_{0.5}P$ crystal, it may be a $(Al_xGa_{1-x})_{0.5}In_{0.5}P$ ($0 \leq X \leq 1$) in which a part of Ga is replaced by Al. Although the $Ga_{0.5}In_{0.5}P$ crystal is grown on the (111) As main plane of the GaAs substrate, further, it may be grown on a plane equivalent to the (111) As main plane, a (111) Ga main plane or a plane equivalent to the (111) Ga main plane. Still further, a (110) GaAs substrate or a plane equivalent thereto may be utilized as well for the same purpose, and MBE may also be utilized in the same manner.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. In a visible light semiconductor laser with $(Al_xGa_{1-x})_{0.5}In_{0.5}P$ ($0 \leq X \leq 1$) crystal layers, the improvement comprising:

a GaAs substrate;

epitaxial layers grown on said GaAs substrate including an active layer of said $(Al_xGa_{1-x})_{0.5}In_{0.5}P$ crystal layers, said active layer being positioned so as to be neither a top layer nor a bottom layer of said epitaxial layers; and p- and n-electrodes provided respectively on a top surface of an uppermost layer of said epitaxial layers and a bottom surface of said substrate for applying a predetermined voltage across said GaAs substrate and said epitaxial layers;

wherein a main plane of said GaAs substrate is one selected from a (110) plane, a plane equivalent to said (110) plane, a (111) plane, and a plane equivalent to said (111) plane.

2. In a visible light semiconductor laser with $(l_xGa_{1-x})_{0.5}In_{0.5}P$ ($0 \leq X \leq 1$) crystal layers, according to claim 1, the further improvement wherein said epitaxial layers are grown by a method selected from metal organic vapor-phase epitaxy (MOVPE) and molecular beam epitaxy (MBE).

3. In a visible light semiconductor laser with $(Al_xGa_{1-x})_{0.5}In_{0.5}P$ ($0 \leq X \leq 1$) crystal layers, according to claim 2, the further improvement wherein said epitaxial layers are grown at a growth temperature of 600 ~ 750° C. and with a V/III ratio of 60 to 450 between V group material and III group material by said MOVPE method.

4. In a visible light semiconductor laser with $Al_xGa_{1-x})_{0.5}In_{0.5}P$ ($0 \leq X \leq 1$) crystal layers, according to claim 2, the further improvement wherein said epitaxial layers include:

an-cladding layer provided on a bottom surface of said active layer and a top surface of said substrate; and a p-cladding layer provided on a top surface of said active layer.

5. In a visible light semiconductor laser with $(Al_x)Ga_{1-x})_{0.5}In_{0.5}P$ ($0 \leq X \leq 1$) crystal layers, according to claim 4, the further improvement wherein said epitaxial layers further include:

an n-current blocking layer, which has a current injection region forming a central longitudinal trench therethrough, and which is provided on a top surface of said p-cladding layer; and a cap layer provided on a top surface of said n-current blocking layer and said current injection region.

6. In a visible light semiconductor laser with $(Al_x Ga_{1-x})_{0.5}In_{0.5}P (0 \leq X \leq 1)$ crystal layers, according to claim 1, the further improvement wherein said epitaxial layers includes, an n-cladding layer provided on a bottom surface of said active layer and a top surface of said substrate; and a p-cladding layer provided on a top surface of said active layer.

7. In a visible light semiconductor laser with $(Al_x Ga_{1-x})_{0.5}In_{0.5}P (0 \leq X \leq 1)$ crystal layers, according to claim 6, the further improvement wherein said epitaxial layers further include;

an n-current blocking layer, which has a current injection region forming a central longitudinal trench therethrough, and which is provided on a top surface of said p-cladding layer; and a cap layer provided on a top surface of said n-current blocking layer and said current injection region.

* * * * *

UNITED STATES PATENT AND TRADEMARK OFFICE
CERTIFICATE OF CORRECTION

PATENT NO. : 4,974,231
DATED : November 27, 1990
INVENTOR(S) : Akiko GOMYO

It is certified that error appears in the above-identified patent and that said Letters Patent is hereby corrected as shown below:

Col. 2, line 17, delete "crystal" and insert --crystal--;

Col. 2, line 17, delete "impossible" and insert --impossible--;

Col. 3, line 16, after "growth" insert --temperature, a V/III ratio a bandgap energy of--;

Col. 5, line 34, delete "A1" and insert --Al--;

Col. 5, line 36, delete "A1" and insert --Al--;

Col. 5, line 49, after "57", insert --having a thickness of approximately 1 $\mu$m is grown to--;

Col. 6, line 2, delete "crystal" and insert --crystal--;

Col. 6, line 65, delete ")Ga$_1$" and insert --Ga$_1$--.

Signed and Sealed this

Twenty-second Day of September, 1992

Attest:

DOUGLAS B. COMER

Attesting Officer     Acting Commissioner of Patents and Trademarks